United States Patent
Clark et al.

(10) Patent No.: US 9,191,009 B1
(45) Date of Patent: Nov. 17, 2015

(54) RADIATION HARDENED BY DESIGN DIGITAL INPUT/OUTPUT CIRCUITS AND RELATED METHODS

(75) Inventors: Lawrence T. Clark, Phoenix, AZ (US); Kyle E. Nielsen, Gilbert, AZ (US)

(73) Assignee: Arizona Board of Regents, for and on behalf of Arizona State University, Scottsdale, AZ (US)

( * ) Notice: Subject to any disclaimer, the term of this patent is extended or adjusted under 35 U.S.C. 154(b) by 1595 days.

(21) Appl. No.: 12/776,188

(22) Filed: May 7, 2010

Related U.S. Application Data

(60) Provisional application No. 61/176,432, filed on May 7, 2009, provisional application No. 61/326,592, filed on Apr. 21, 2010.

(51) Int. Cl.
*H03K 19/23* (2006.01)
*H03K 19/003* (2006.01)

(52) U.S. Cl.
CPC .......... *H03K 19/23* (2013.01); *H03K 19/00392* (2013.01)

(58) Field of Classification Search
CPC ............. G01R 9/0038; H03K 19/0033; H03K 19/00392; H03K 19/17764; H03K 19/23
USPC ................................................. 326/9–11, 63
See application file for complete search history.

(56) References Cited

U.S. PATENT DOCUMENTS

| | | | |
|---|---|---|---|
| 6,247,143 B1 * | 6/2001 | Williams | 714/11 |
| 6,667,520 B1 * | 12/2003 | Fulkerson | 257/369 |
| 6,838,899 B2 * | 1/2005 | Plants | 326/9 |
| 7,047,440 B1 * | 5/2006 | Freydel et al. | 714/11 |
| 7,266,020 B1 * | 9/2007 | Trimberger | 365/189.02 |
| 7,424,642 B2 * | 9/2008 | Howell et al. | 714/12 |
| 7,444,565 B1 * | 10/2008 | Haight | 714/725 |
| 7,451,421 B1 * | 11/2008 | Bauer et al. | 716/138 |
| 7,467,326 B2 * | 12/2008 | Hillman et al. | 714/11 |
| 7,476,953 B2 * | 1/2009 | Taylor et al. | 257/421 |
| 7,548,405 B2 * | 6/2009 | Czarnecki et al. | 361/111 |
| 7,898,284 B2 * | 3/2011 | Martin et al. | 326/9 |
| 8,390,327 B1 * | 3/2013 | Parkhurst et al. | 326/80 |
| 8,698,139 B2 * | 4/2014 | Bazarjani et al. | 257/48 |
| 2008/0007312 A1 * | 1/2008 | Clark et al. | 327/218 |

OTHER PUBLICATIONS

DeGregorio et. al.—Rad-Hard Reconfigurable Bi-Directional Level Shifter (ReBiLS) for NASA Space Applications in the Flexfet™ 0.18 µm SOI CMOS Technology, 12th NASA Symposium on VLSI Design, Coeur d'Alene, Idaho, USA, Oct. 4-5, 2005.*

Rockett, L., "Designing CMOS data cells for space systems," Microelectronics Journal, Dec. 2004, pp. 953-967.

Mavis, D. et al., "Soft error rate mitigation techniques for modern microcircuits," in Proceedings of IEEE Reliability Physics Symposium, Aug. 2002, pp. 216-225.

Knudsen, J. et al., "An area and power efficient radiation hardened by design flip-flop," IEEE Transactions on Nuclear Science, vol. 53 No. 6, Dec. 2006, pp. 3392-3399.

(Continued)

*Primary Examiner* — Alexander H Taningco
*Assistant Examiner* — Kurtis R Bahr
(74) *Attorney, Agent, or Firm* — Withrow & Terranova, P.L.L.C.

(57) ABSTRACT

Embodiments of radiation hardened by design digital input/output circuits are described herein. Other examples and related methods are also disclosed herein.

22 Claims, 11 Drawing Sheets

(56) References Cited

OTHER PUBLICATIONS

Lacoe, R. et al., "Application of hardness-by-design methodology to radiation-tolerant ASIC technologies," IEEE Transactions on Nuclear Science, vol. 47 No. 6, Dec. 2000, pp. 2334-2341.

Holmes, A. et al., "Handbook of Radiation Effects," New York: Oxford University Press, Mar. 2002, pp. 84-91; 356-357; 118-128; 97-111; 482-485.

Barnaby H., "Total-ionizing-dose effects in modern CMOS technologies," IEEE Transactions on Nuclear Science, vol. 53 No. 6, Dec. 2006, pp. 3103-3121.

Gadlage, M. et al., "Single event transient pulsewidths in digital microcircuits," IEEE Transactions on Nuclear Science, vol. 51 No. 6, Dec. 2004, pp. 3285-3290.

Mohr, K. et al., "Experimental characterization and application of circuit architecture level single event transient mitigation," Proceedings of the 45th Annual International Reliability Physics Symposium, Apr. 2007, pp. 312-317.

Zhou, Q. et al., "Transistor sizing for radiation hardening," Proceedings of the International Reliability Physics Symposium, Apr. 2004, pp. 310-315.

Carmicheal, C., "Triple module redundancy design techniques for virtex FPGAs," Xilinx, San Jose, CA, Application Note XAPP197, V1.01, Jul. 1996, www.xilinx.com/support/documentation/application_notes/xapp197.pdf, 37 pages.

Swift, G. et al., "Dynamic testing of xilinx vertex-II field programmable gate array (FPGA) input/output blocks (IOBs)," IEEE Transactions on Nuclear Science, vol. 51 No. 6, Dec. 2004, pp. 3469-3474.

Dabral, S.. et al., "Basic ESD and I/O Design," Section 2.6.2-2.7.1, New York: Wiley, Nov. 1998, 2 pages.

Hindman, N. et al., "High speed redundant self correcting circuits for radiation hardened by design logic," presented at the RADECS, Brugge, Belgium, Sep. 14-18, 2009, pp. 465-472.

Yao, X. et al., "A 90 nm bulk CMOS radiation hardened by design cache memory," IEEE Transactions on Nuclear Science, vol. 57 No. 4, Aug. 2010, pp. 2089-2097.

Maloney, T. et al, "Methods for Designing Low-leakage Power Supply Clamps," Electrical Overstress/Electrostatic Discharge Symposium, Sep. 2003, 7 pages.

Silvestri, M. et al., "Degradation induced by X-ray irradiation and channel hot carrier stresses in 130-nm NMOSFETs with enclosed layout," IEEE Transactions on Nuclear Science, vol. 55 No. 6, Dec. 2008, pp. 3216-3222.

Weatherford, T., "From Carriers to Contacts, A Review of SEE Charge Collection Processes in Devices" IEEE NSREC Short Course, Section IV, Jul. 15, 2002, 54 pages.

* cited by examiner

RADIATION HARDENED BY DESIGN DIGITAL INPUT/OUTPUT CIRCUITS AND RELATED METHODS

CROSS REFERENCE TO RELATED APPLICATIONS

This application claims priority to:

U.S. Provisional Patent Application 61/176,432, filed on May 7, 2009, and titled "Radiation Hardened By Design Digital I/O For High SEE and TID Immunity," and U.S. Provisional Patent Application 61/326,592, filed on Apr. 21, 2010, and titled "Radiation Hardened By Design Digital Input/Output and Related Methods."

The disclosures of each of the applications referenced above are incorporated herein by reference.

STATEMENT REGARDING FEDERAL GOVERNMENT SPONSORSHIP

At least part of the disclosure herein was funded with government support under grant number FA-945307-C-0186, awarded by the Air Force Research Laboratory Space Vehicles Directorate. The United States Government may have certain rights in this invention.

FIELD OF THE INVENTION

This invention relates generally to integrated circuits, and relates, more particularly, to radiation hardened by design digital input/ouput circuits and related methods.

BACKGROUND

Input and output (I/O) circuits on an integrated circuit (IC) provide communication between external devices and the core logic circuits. In modern microcircuits, the I/O and core circuits operate at different voltages. Typically, modern microcircuits use a higher input/output voltage ($V_{DDIO}$) of, for example, 3.3 V, 2.5 V, or 1.8 V, while the core supply voltage ($V_{DD}$) can be of approximately 1.2 V or lower in sub-130 nm process technologies. The higher $V_{DDIO}$ allows interconnection to ICs operating at legacy voltages and potentially improves board level signal noise immunity.

Mitigating radiation effects is important for ICs that are intended for harsh environments such as spacecraft. Ionizing radiation can affect the IC long term reliability through total ionizing dose (TID) effects, which impact individual device characteristics over time. Furthermore, the IC logic state may be temporarily altered to be incorrect by charge collected from ionizing radiation particle strikes, e.g., single event effects (SEE) produced by impinging heavy ions or protons. These particles can also produce a single event transient (SET) that can cause improper logic outputs or timing.

Correct communications into and out of an IC in the presence of ionizing radiation is important, particularly to avoiding placing the IC into an incorrect functional state, known as a single event functional interrupt (SEFI) which may include issuing an inadvertent command, such as erroneously asserting the reset. An I/O SET may also shorten a reference clock edge, which may result in loss of phase loop lock. Specialized radiation hardened processes have typically used silicon on insulator (SOI) substrates. The shorter path length that an ionizing radiation particle can travel in the silicon beneath the active circuits limits the amount of charge that can be collected. Consequently, for these processes, the relatively large I/O circuit capacitances and low-pass characteristics of digital circuits may mitigate SETs. Radiation hardening by design (RHBD) approaches include temporal redundancy to mitigate SETs but these impact the circuit speed.

Radiation effects in complementary metal-oxide-semiconductor (CMOS) circuits are primarily manifest as prompt dose, TID, single event latchup (SEL), and other SEE. TID effects are principally exhibited as long-term degeneration of device characteristics due to positive trapped charge in oxides that are exposed to ionizing radiation. Prompt dose effects are due to the collection of photocurrents produced by incident radiation. The primary IC effect is power rail voltage (rail span) collapse due to inability of the power supply or IC wiring to deliver the required currents.

Total Ionizing Dose Effects:

Total ionizing dose effects are produced when ionizing radiation creates electron-hole pairs within the oxides. These can induce both trapping damage, which affects the sub-threshold slope, and threshold voltage ($V_{th}$) shifts. Electrons, which are more mobile, can escape, and the holes produce a net positive charge. For commercial processes the core oxide scaling trend, which has reduced thicknesses below 5 nm, eliminates $V_{th}$ shifts by allowing both holes and electrons to escape the gate oxide before being trapped. Improved oxynitride gate composition has also reduced trapping damage. However, thick-gate transistors are still used in I/O circuits to allow high voltage tolerance and thus legacy voltage compatibility. Consequently, the thicker gate oxide transistors used in I/O circuits, as well as the very thick IC isolation oxides, i.e., shallow trench isolation (STI), remain vulnerable to TID effects in modern microcircuits fabricated on sub 100 nm technology nodes.

TID primarily shifts metal-oxide-semiconductor (MOS) transistor threshold voltage ($V_{th}$) downwards. P-Type MOS (PMOS) transistors are affected, but an increase in the parasitic (field) transistor $V_{th}$ has no deleterious effects. TID produces two primary N-Type MOS (NMOS) transistor leakage paths. Drain-to-source leakage in a single NMOS transistor is produced by a reduction in the $V_{th}$ at the transistor edges, i.e., the interface between the thin and thick oxides. The second primary leakage current path is created under the STI between diffusion areas, i.e., between NMOS sources or drains at different biases or from an NMOS source/drain diffusion to the N-type well.

SEU and SET in Microcircuits:

SEE logic upsets are manifest as single event upsets (SEU) and single event transients. SEU is due to impinging ionizing particles, such as cosmic rays or protons, generating charge that upsets the logic state of bi-stable storage elements. An SET is a temporary voltage glitch in combinational logic generated by the collection of charge deposited by a massive ionizing particle such as a heavy ion. The glitch to the wrong state is temporary, and its duration is dependent on the linear energy transfer (LET) of the striking ion and the capacitance and current drive of the node struck. Thus, SETs only upset the IC architectural state when captured by a receiving sequential circuit. For higher IC operating frequencies and reduced operating voltages, SET mitigation has become critical, since the amount of charge deposited does not scale, resulting in transient durations of over 1 ns. A sufficient current drive and/or node capacitance can mitigate any SET at the actual large pad drivers in I/O circuits. However, the small receiver, level shifting, and buffering circuits are vulnerable and must be otherwise protected.

Radiation Hardening by Design:

RHBD uses layout techniques to avoid creating or cut off the leakage current flow produced by prolonged TID exposure Annular, or edgeless, transistors apply the same bias across any transistor gate oxide to isolation oxide interface and thus eliminate NMOS transistor drain-to-source leakage increase due to TID. P+ guard rings create a back to back diode structure to interrupt current paths created by trapped positive charge in isolation oxides. Alternating P+ and N+ guard rings protect against latchup due to beyond the rail voltages applied to the pads or in other circuits due to particle strikes.

Recently, due to the dramatically increasing processing costs and greater availability of state-of-the-art commercial foundry capacity, providing radiation hardness solely through design techniques rather than a specialized fabrication process, has garnered increased attention. Previous I/O SEE RHBD Approaches: have focused on field-programmable-gate-array (FPGA) based designs with triple modular redundancy (TMR) I/O circuits, achieved by triplication of the pads and triplication of driving/receiving circuits. Such approaches have been inefficient due to the large increase in area and resources needed to achieve TMR. A need thus exists in the art to develop radiation hardened by design digital input/output circuits and related methods that address such limitations of the current technology.

BRIEF DESCRIPTION OF THE DRAWINGS

The invention will be better understood from a reading of the following detailed description of examples of embodiments, taken in conjunction with the accompanying figures in the drawings in which.

Figure 1:
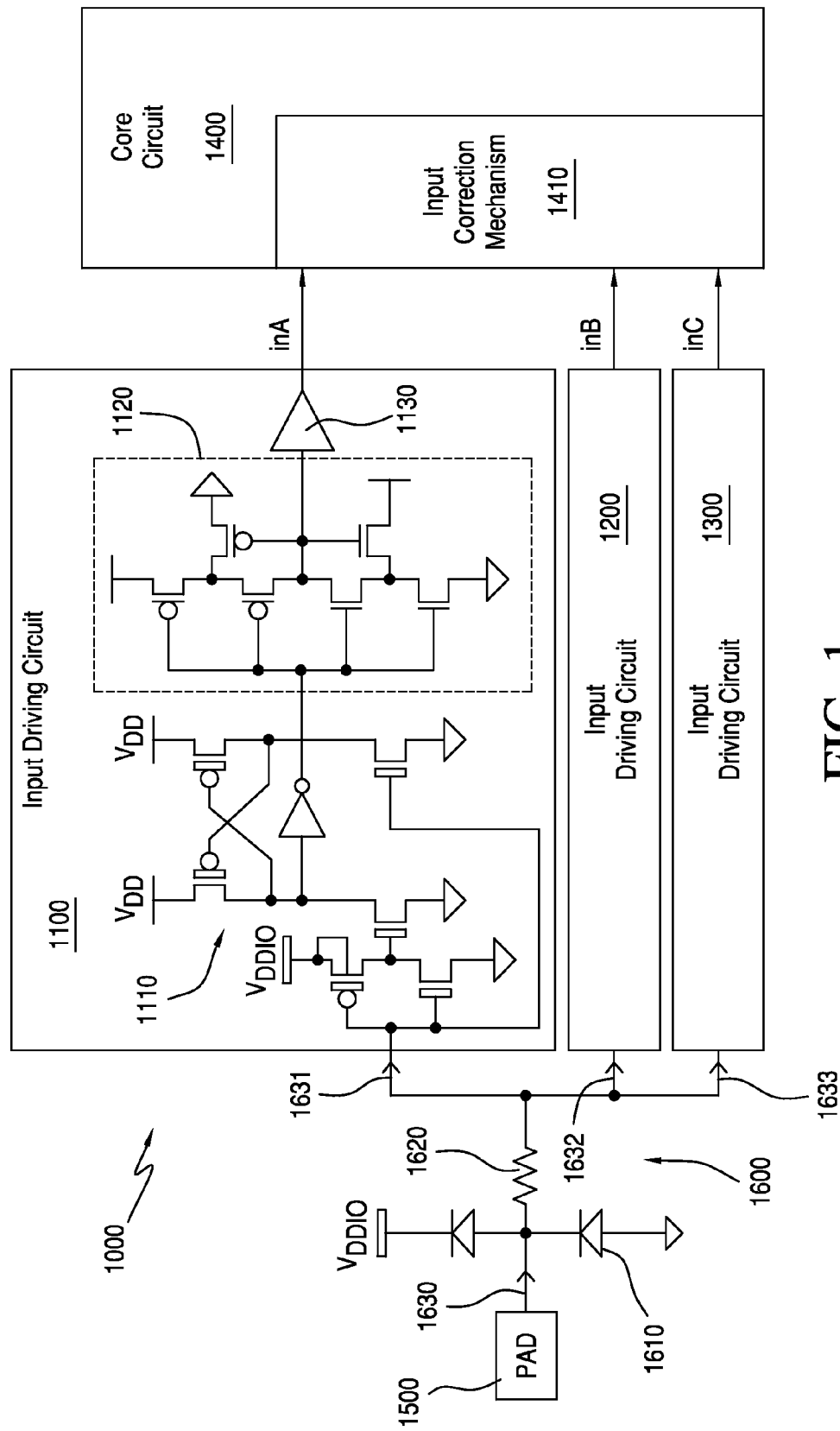
FIG. 1 illustrates a schematic of an input pad circuitry for an input pad.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

In one embodiment, an integrated circuit with radiation hardened by design protection can comprise a first pad of one or more pads, and a first pad circuitry of the first pad, wherein the first pad circuitry is coupled to the first pad, the first pad circuitry is triple-redundant, and the first pad is non-redundant.

In one embodiment, a method for providing an integrated circuit with radiation hardened by design protection can comprise providing a first pad of one or more pads, the first pad being non-redundant, and providing a first pad circuitry of the first pad, the first pad circuitry being triple-redundant.

In one embodiment, an integrated circuit can comprise one or more transistors, a first pad of one or more pads; and a first pad interface circuit to couple the one or more transistors to the first pad. The one or more pads can be at least one of input pads for the integrated circuit, or output pads for the integrated circuit. The first pad is single-redundant and can be coupled to the one or more transistors via the first pad interface circuit. The first pad interface circuit is triple-redundant and comprises a first circuit configured to handle a first data copy of a triple redundant data, a second circuit configured to handle a second data copy of the triple redundant data, and a third circuit configured to handle a third data copy of the triple redundant data. The first, second, and third circuits can be are separated from each other by at least approximately 10 μm.

In this disclosure, we apply TMR techniques to the I/O circuits of application-specific integrated circuit (ASIC) designs that employ full fine-grained TMR in high speed core circuits. Other embodiments may use different TMR core circuits and or granularity of the redundancy.

Several implementations may be carried out for input circuits, for output circuits/, and/or for input/output circuits. In the embodiments and approaches described herein, while the pads utilize TMR to mitigate SETs that may occur in the signaling path, a single pad is used per signal. The input pad splits a given input into three separate A, B, and C copies, which are correctable by voting in the IC core circuits. The output pad is similarly controlled by three copies of a given data bit, which are voltage shifted up and fed into a majority gate pad driving stage. Such approaches thus require 67% fewer input or output pads than when using the FPGA approach described above with TMR pads.

There are several circuits that IC pads of the embodiments described herein may require. For example, ASIC I/O circuits can include electrostatic discharge (ESD) protection, hysteretic noise rejection circuits, voltage level converters, and buffer circuits to drive the IC pad or internal routes to the core circuitry. For example, buffers may be supplied for both input and output pads. Dual N-type and P-type guard rings provide SEL and signal overshoot induced latchup mitigation in the pads. The guard rings also interrupt potential current paths induced by TID due to inversion of the shallow trench isolation (STI), thereby mitigating inter-device leakage. The circuit techniques described here are applicable to any RHBD IC using TMR techniques.

Figure 2:
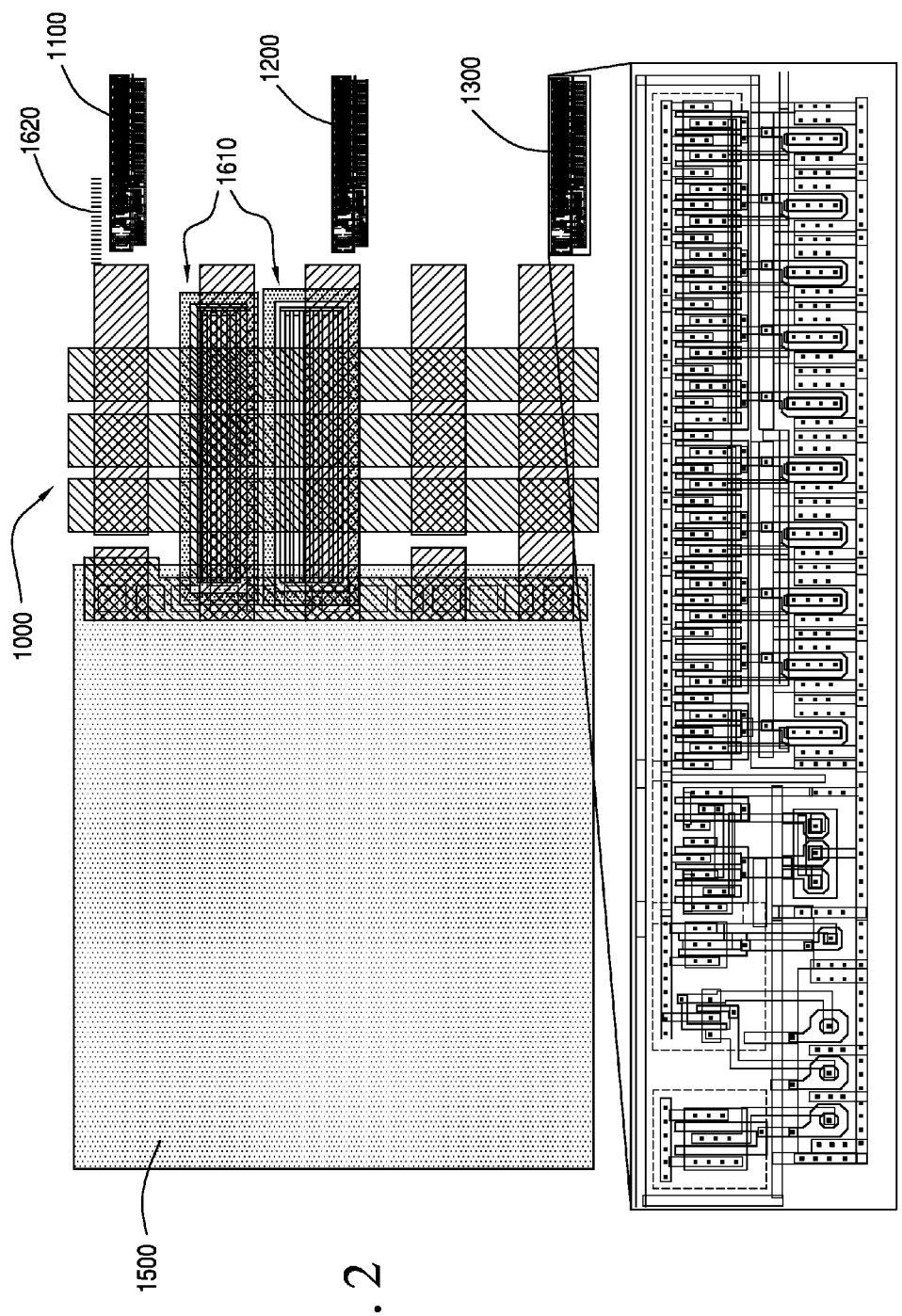
FIG. 2 illustrates an example of an implementation of a topology for the embodiment of FIG. 1

Input Pad Design:

Turning to the drawings, FIG. 1 illustrates a schematic of input pad circuitry 1000 for input pad 1500. FIG. 2 illustrates an example of an implementation of a topology for the embodiment of FIG. 1

In the current example, pad 1500 is directly connected to input path 1600, which is coupled to ESD protection diodes 1610, and which includes current limiting resistor 1620. After resistor 1620, input path 1600 splits to create three copies of input data 1630, namely, input copy 1631, input copy 1632, and input copy 1633. In this example, there are no diffusions to collect charge between resistor 1620, which can be a polysilicon resistor, and the input buffers. The large drive and board capacitance is sufficient to eliminate SETs at those nodes on the pad, package, and/or board side of resistor 1620.

Input path 1600 feeds into input path circuitry 1000, where input copy 1631 is fed to input driving circuit 1100, input copy 1632 is fed to input driving circuitry 1200, and input copy 1633 is fed to input driving circuit 1300. Input driving circuitry 1100 comprises high-to-low level shifter 1110 (nominally shifting 2.5 V to 1.0 or 1.2 V in the presente example, where a CMOS cascode voltage switch design is used). Schmitt trigger 1120 provides hysteresis, and finally, buffer 1130 drives the processed input copy 1631 to core circuit 1400. Thick-gate transistors for pad 1500 are located in voltage level shifter 1110, to provide compatibility with high voltages. The thick-gate transistors can have effective ($SiO_2$ equivalent) thick-gate oxides of approximately 30 nm to approximately 50 nm, while other transistors can have thin-gate oxides of approximately 10 nm to approximately 25 nm. By effective oxide thickness, we mean equivalent $SiO_2$ thicknesses, as used in circuit simulators. Other oxide materials, such as those incorporating nitride or Hf, may have different actual thicknesses, as understood to those skilled in the art. In the present example, input driving circuits 1200 and 1300 are similar to input driving circuit 1100, but configured to transmit and process input copies 1632 and 1633, respectively, to core circuit 1400. Core circuit 1400 comprises input correction mechanism 1410 in the present example, configured to compare input copies 1631, 1632, and 1633, as received from input driving circuits 1100, 1200, and 1300, respectively. Input correction mechanism 1410 can then determine whether one of input copies 1631-1633 is corrupt, and elect a non-corrupt status for input data 1630.

On modern nanometer scale fabrication technologies, one ionizing radiation particle can upset multiple circuit nodes. To avoid this, we maximized the spacing of the redundant circuit cells in the pads for the present example, as can be seen in FIG. 2. A pad pitch of 100 μm was used for the examples here, although other pad pitches, such as 70 μm, are also possible. Sub-circuit placements were made to maximize the redundant node spacing, while meeting the pitch requirements. FIG. 2 also shows that annular NMOS gates are used throughout, for both thin-gate and thick-gate transistors. To allow compatibility between the standard and low standby power (LSP) versions of the foundry 90 nm process, the longer core transistor channel length required by the latter is used throughout. Some modern fabrication processes may not support such edgeless transistor gate geometries. The SEE protection described herein, however, can still be accomplished without edgeless transistor gate geometries, which mainly afford TID mitigation.

Figure 3:
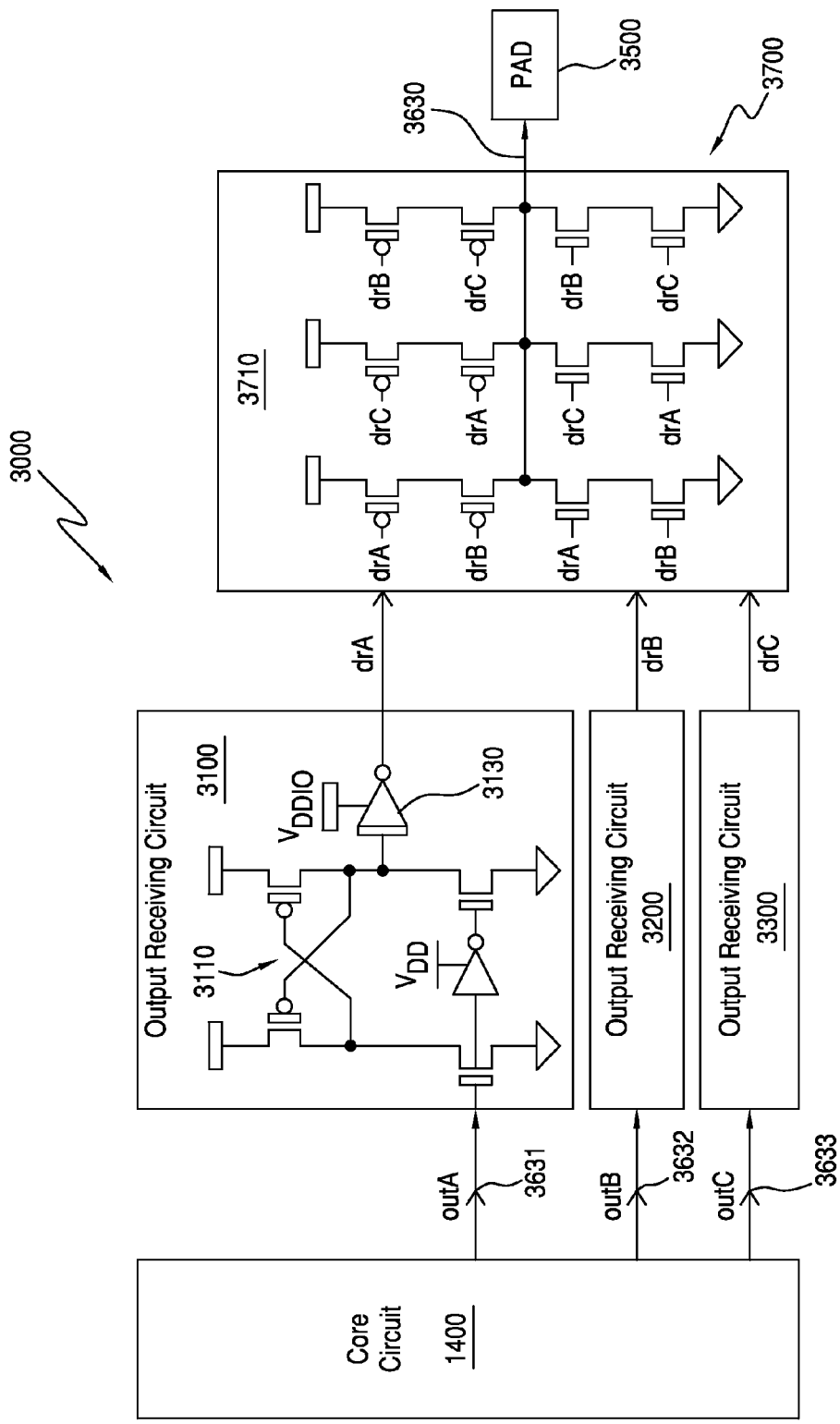
FIG. 3 illustrates a schematic of an output pad circuitry for an output pad.
Figure 4:
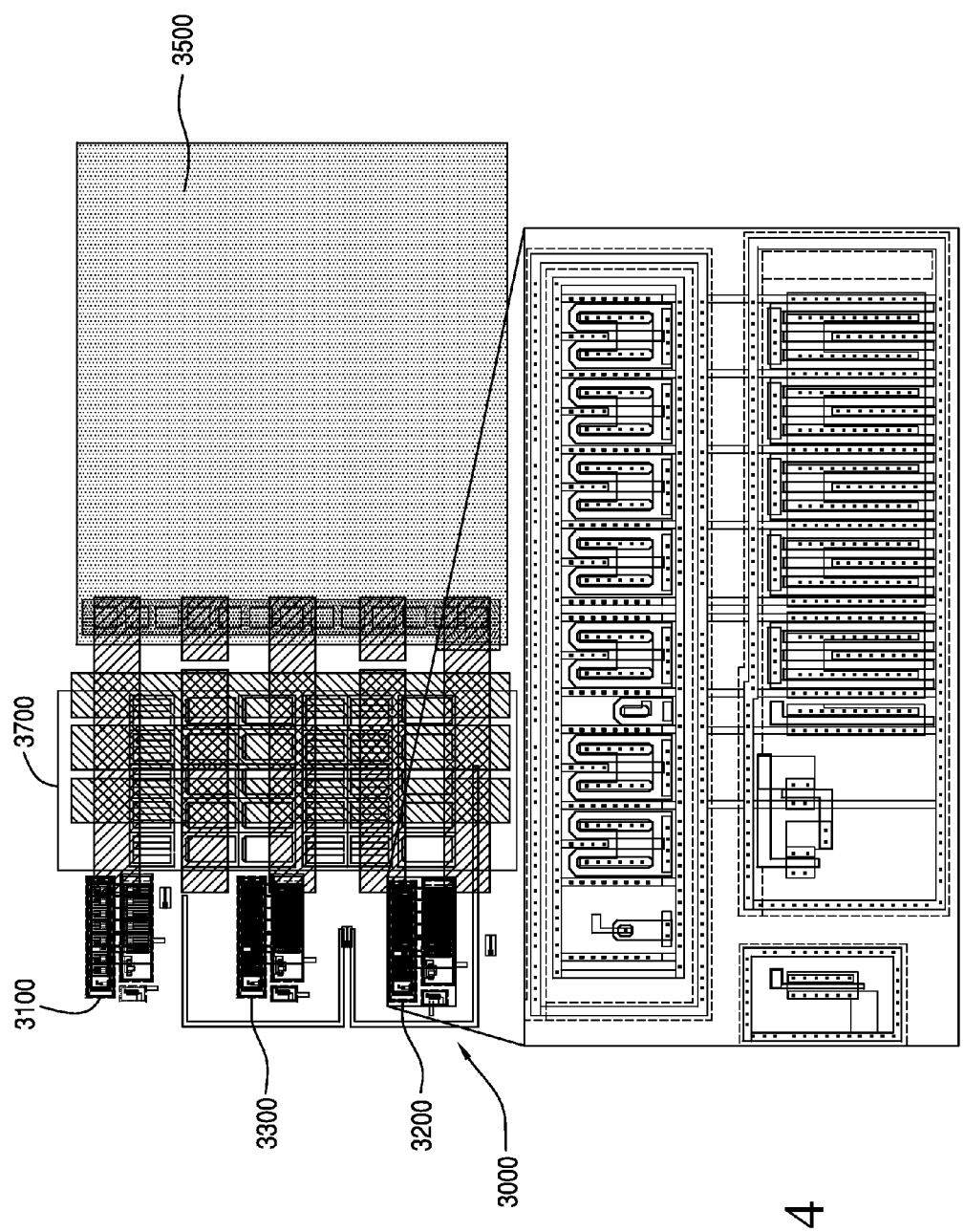
FIG. 4 illustrates an example of an implementation of a topology for the embodiment of FIG. 3.
Figure 5:
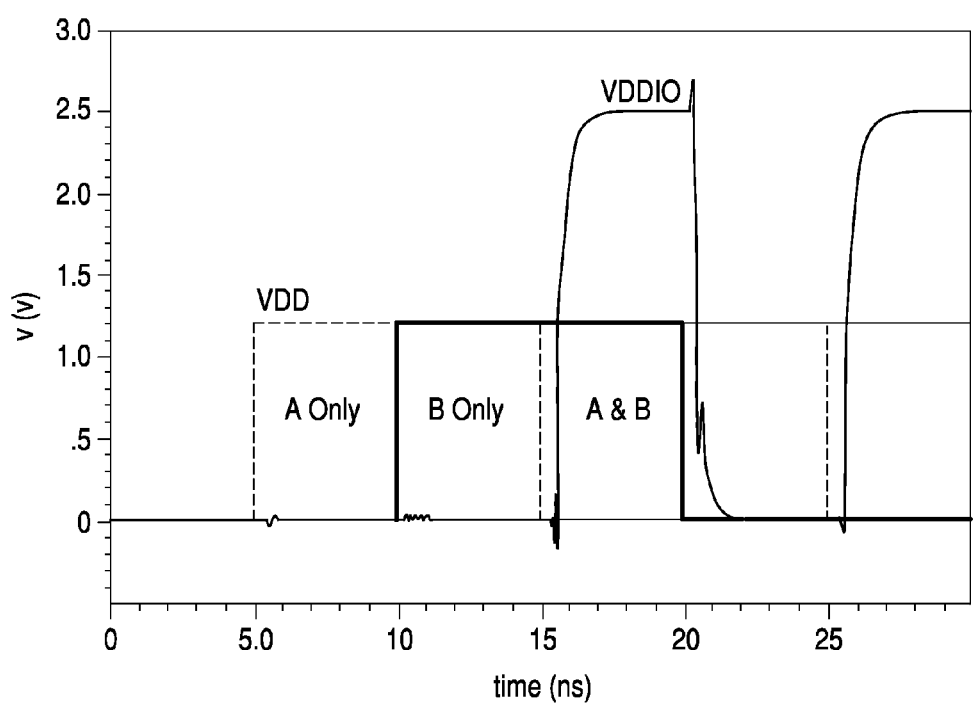
FIG. 5 illustrates a diagram of an operation of the output pad circuitry of FIG. 3, handling output data mismatches for the output pad of FIG. 3

Output Pad Design:

FIG. 3 illustrates a schematic of output pad circuitry 3000 for output pad 3500. FIG. 4 illustrates an example of an implementation of a topology for the embodiment of FIG. 3. FIG. 5 illustrates a diagram of an operation of output pad circuitry 3000 handling output data mismatches for output pad 3500.

In the present embodiment, output copies 3631, 3632, and 3633 are transmitted by core circuit 1400 to output pad circuitry 3000, where output copy 3631 is received by output receiving circuit 3100, output copy 3632 is received by output receiving circuit 3200, and output copy 3633 is received by output receiving circuit 3300. Output copies 3631-3633 are TMR copies of each other, and output receiving circuits 3100, 3200, and 3300 are TMR versions of each other.

In the present example, output receiving circuit 3100 includes a differential CMOS low-to-high level-shifter 3110 to translate output copy 3631 up from core voltage $V_{DD}$ to $V_{DDIO}$ levels each redundant data path. In some examples, the core voltage $V_{DD}$ can be of approximately 0.5 V to 1.5 V, and the $V_{DDIO}$ levels can be of approximately 1.5 V to 3.5 V, but there can be other examples compatible with higher I/O voltages. Level shifter 3110 has been confirmed to operate for $V_{DDIO}$=1.8 V with core supply voltages $V_{DD}$ as low as 0.6 V. The level shifted output signal 3631 is then buffered at output buffer 3130 and transmitted to output driving circuit 3700 which controls the pad voltage. In the present example, output driving circuit 3700 comprises majority gate 3710, configured to receive and vote output copies 3631-3633 from output receiving circuits 3100, 3200, and 3300, respectively, to determine a non-corrupt status for output data 3630. Output driving circuit 3700 prevents data corruption on the output in the event that one of the core TMR paths for output copies 3631-3633 disagrees with the others or when an SET occurs in the pad circuitry. Output transistor drain diodes can provide the ESD path to $V_{DDIO}$ and $V_{SS}$ in the output pads.

As seen in the topology of FIG. 4, care was taken to ensure large critical node spacing for the level shifting and buffer circuits. The pad capacitance, which can range in some examples from approximately 1 picofarad (pF) to approximately 30 pF (when the board level contribution is included) combined with the larger $V_{DDIO}$, is sufficient to absorb any SET induced charge at the output driver transistor drains. The level shifter and buffer circuit layout is shown at the bottom of FIG. 4. As in FIG. 2, annular NMOS transistor gate topologies are used throughout this embodiment. Simulated output pad operation with one input incorrect is shown in FIG. 5, where the output transitions only with the majority of the inputs as expected. Majority gate 3710 was sized to provide the same current as a single redundant pad in the event of a mismatch on one input. Such sizing allows faster signal timing at the board level, even if there is an SET on one of the TMR core signals exiting the IC.

Simulation of TMR Power Impact:

TMR input and/or output pads and related circuitry, such as those described above for FIGS. 1-4, can impact the overall energy consumption of the chip, but in a high performance design, this impact is not large, due to a number of factors. First, the I/Os generally operate at a lower frequency than the core circuits. For our test chip, core circuits can operate at over 500 MHz and the I/Os operate at 100 MHz. Secondly, power dissipation (or energy per transition) is proportional to the capacitance of each node. The overall capacitance is dominated by the pad, package, and board trace, rather than the redundant circuits.

Non-redundant and TMR versions of the pads were simulated with extracted parasitics to quantify the TMR power impact, as summarized in Table I. The pad energy dissipation for non-redundant output pad was estimated to be at approximately 77.5 picoJoules (pJ) per transition, while the pad energy dissipation for the TMR pad circuitry of FIGS. 3-4 was estimated to dissipate 115 pJ/transition when driving a load of 10 pF. The 48% increase can be attributed to triplication of the level shifters and output buffers, as well as the large size of the majority gate transistors, which as mentioned, have increased in drive strength. In the output pad, the total gate width increased 65% from the non-redundant to the TMR version. Simulating the input pad with single and triple redundancy resulted in an energy usage of 294 femtoJoules (fJ) per transition and 1350 fJ/transition, respectively. Such increase results from the threefold increase in data paths that must drive the core logic, as well as an increase in buffer sizes, which were added to speed the signaling from the pads to the core circuits. The input pad power dissipation is much smaller than the output pad power, and such increase does not significantly affect overall IC power. For a design with half input and half output pads, the overall I/O power impact of the TMR pads is thus less than 50%.

TABLE I

IMPACT OF TMR ON I/O ENERGY

| | Energy per Transition (pJ) | |
| --- | --- | --- |
| | Input Pad | Output Pad |
| Non-redundant | 0.294 | 77.5 |
| TMR | 1.35 | 115 |

Figure 6:
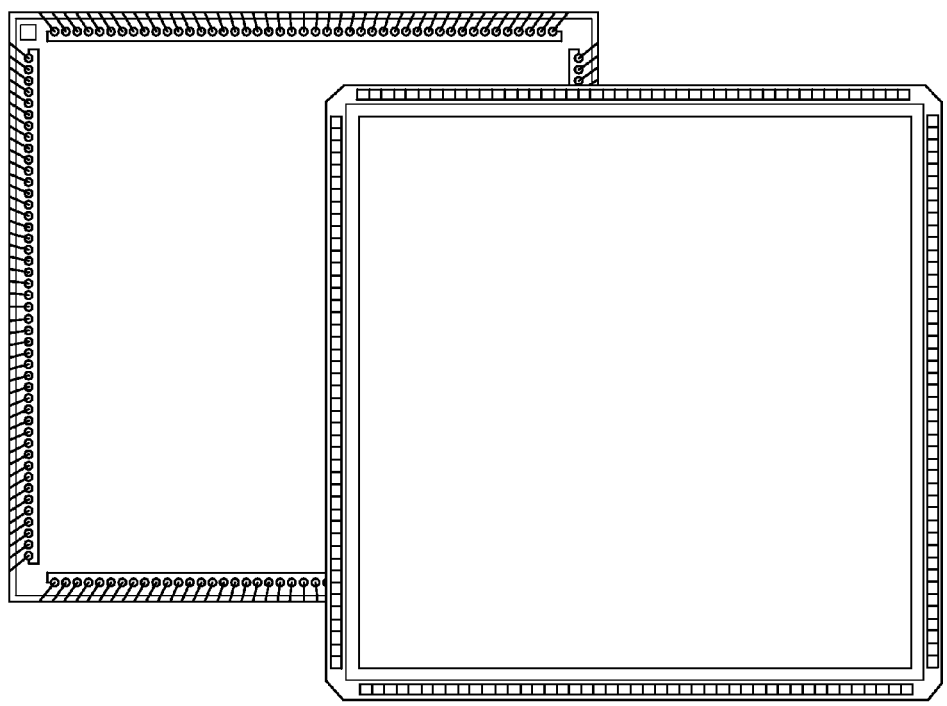
FIG. 6 illustrates a test die and pad ring layout for an implementation encompassing the circuits of FIGS. 1-5.

Experimentally Measured Results: A test chip with TMR pads in accordance with the present disclosure was fabricated on a 90 nm process, where the TMR pads comprise 57 input, 73 output, 12 $V_{DDIO}$, 11 $V_{DD}$, and 24 $V_{SS}$ pads. The device under test (DUT) is composed of a RHBD fully TMR high speed built-in self-test engine to test a RHBD cache. FIG. 6 shows the test die and pad ring layout. The die is 5 mm by 5 mm.

Figure 7:
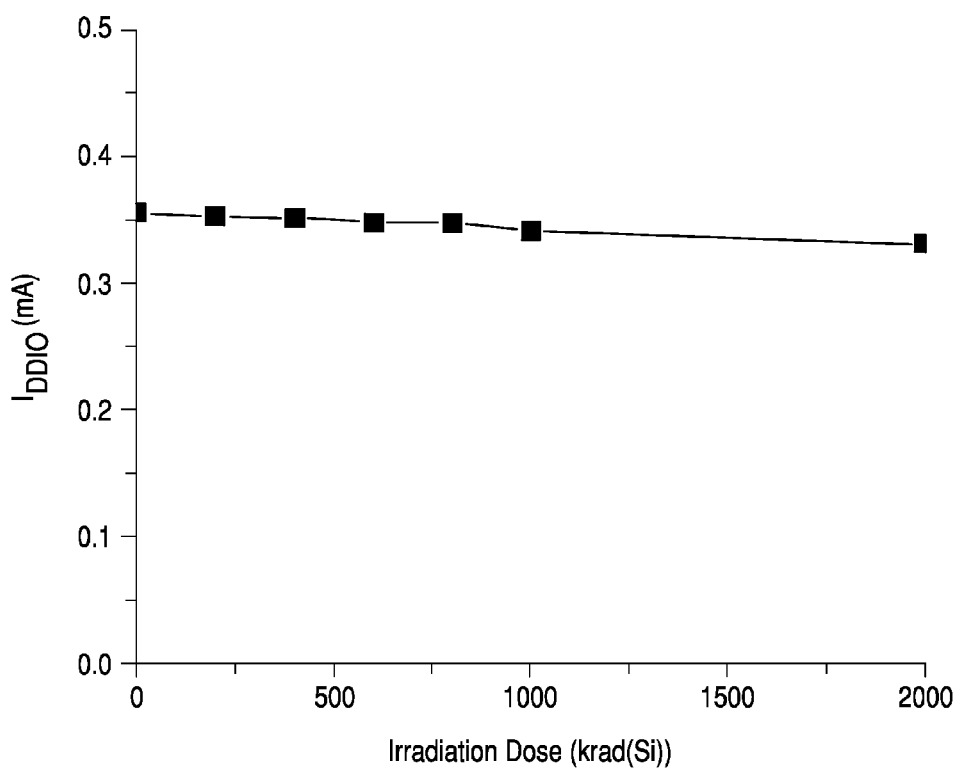
FIG. 7 shows TID impact, for irradiation up to 2 Mrad(Si), on a thick-gate circuit on the circuitry of FIGS. 1-6.

The DUT was irradiated using a Co-60 Gammacell 220. FIG. 7 shows the TID impact on the thick-gate circuit (2.5 V supply $V_{DDIO}$) leakage current ($I_{DDIO}$) for irradiation up to 2 Mrad(Si). The results show a slight but steady decrease in the $V_{DDIO}$ leakage current $I_{DDIO}$ with radiation dose. The decrease was 8.7% after 2 Mrad(Si). The small $I_{DDIO}$ deviation demonstrates the effectiveness of the TID mitigation.

SEE testing was performed at the Texas A&M University Cyclotron Institute SEE Beam Line. N, Ne, Ar, Cu, Kr and Au ions were used with LET ranging from 1.4 to 92.9 MeV-cm$^2$/mg. Angles of 0° to 79° with 0° being perpendicular to the die surface were used in two orientations, across the top and bottom I/Os and across the left and right I/Os in the pad ring. The effective LET ($LET_{eff}$) thus ranged from 1.4 to 219.8 MeV-cm$^2$/mg. No errors were recorded in the TMR I/Os, demonstrating the efficacy of the invention.

Figure 8:
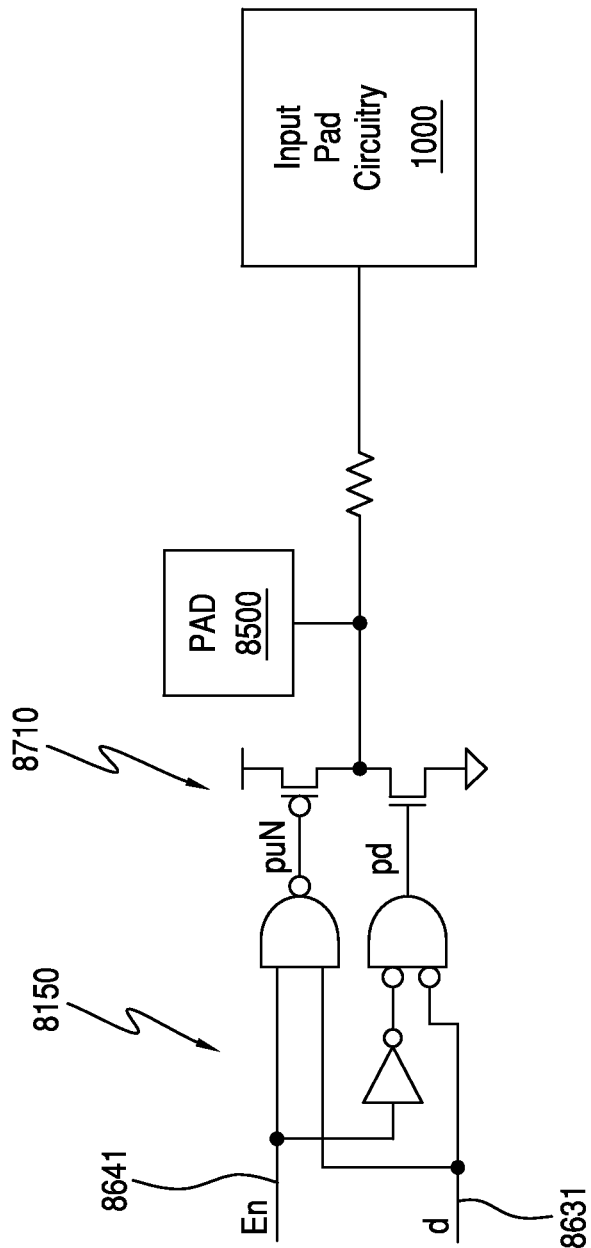
FIG. 8 illustrates a schematic of a portion of an output control circuit for an input/output pad.
Figure 9:
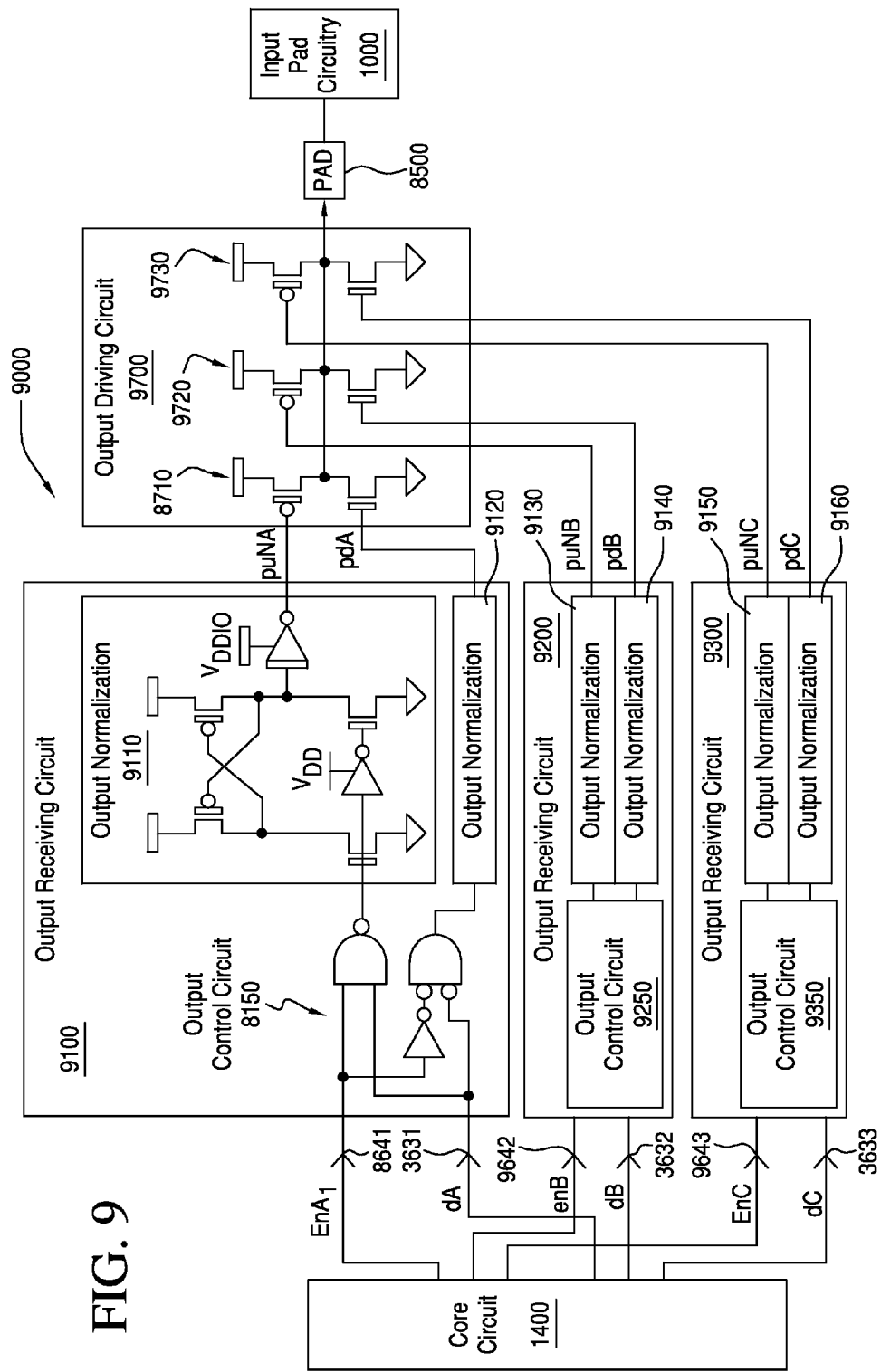
FIG. 9 is a schematic of an input/output pad circuitry for an input/output pad.
Figure 10:
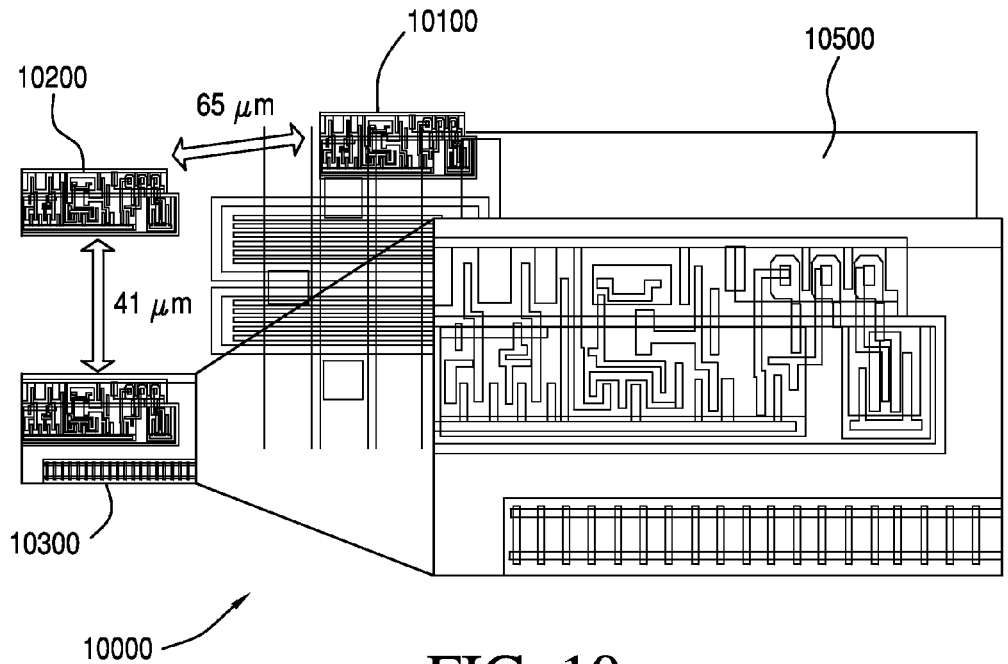
FIG. 10 shows an example of an implementation of a topology for an input pad and related input pad circuitry at a 70 micrometer (μm) pad pitch.

Input/Output Pad Design:

The circuits described above with respect to FIGS. 1-7 used only input or output pads to reduce risk and design time. Modern ASICs, however, often require bidirectional pads. Fortunately, the disclosure herein is equally applicable to such bidirectional pads, as seen in the examples of FIGS. 8-10. FIG. 8 illustrates a schematic of a portion of output control circuit 8150 for input/output pad 8500. FIG. 9 is a schematic of input/output pad circuitry 9000 for output pad 8500, where input/output pad circuitry 9000 comprises output control circuit 8100 of FIG. 8.

In the present example, output control circuit 8150 is configured to receive enable signal 8641 and control NMOS/PMOS pair 8710 based on the value of enable signal 8641. In the present example, NMOS/PMOS pair 8710 is part of output driving circuit 9700, which also comprises NMOS/PMOS pairs 9720 and 9730. NMOS/PMOS pairs 8710, 9720, and 9730 are redundant to each other and, being smaller and less complicated than the previously described output driving circuits of FIGS. 3-4, output driving circuit 9700 can be easier to tri-state such as to permit pad 8500 to be used as either an input or an output pad. The small size and simplicity of output driving circuit 9700 may also permit easily adding slew rate and drive strength control, which can be helpful to reduce board level noise for a simpler driver.

In the present example, pad 8500 is driven by triple redundant NMOS and PMOS pairs 8710, 9720, and 9730, all of which can be simultaneously disabled to tri-state the output driving circuit 9700. FIG. 8 shows the logical description, where enable signal 8641 tri-states pad 8500 when de-asserted. This configuration allows pad 8500 to drive input pad circuitry 1000 (from FIG. 1) in the present example. The example of FIG. 8 is expanded in FIG. 9 to encompass output control circuits 9250 and 9350, which are triple redundant with output control circuit 8150. When enable signals 8641, 9642, and 9643 are de-asserted, output control circuits 8150, 9250, and 9350 cause NMOS/PMOS transistor pairs 8710, 9720, and 9730, respectively, to be tri-stated such that input/output pad 8500 can be used as an input pad. Conversely, when enable signals 8641, 8642, and 8643 are asserted, output control circuits 8150, 9250, and 9350 transmit output copies 3631, 3632, and 3633 towards input/output pad 8500 via output driving circuit 9700 such that input/output pad 8500 can be used as an output pad.

The example of FIG. 9 shows how output control circuit 8110 is coupled to level shifting output normalization circuits 9110 and 9120 of output receiving circuit 9100. Similarly, output control circuit 9250 is coupled to output normalization circuits 9130 and 9140 of output receiving circuit 9200, and output control circuit 9350 is coupled to output normalization circuits 9150 and 9160 of output receiving circuit 9300. In the present example, each of output normalization circuits 9110, 9120, 9130, 9140, 9150, and 9160 are similar to output receiving circuit 3100 of FIG. 3, although other configurations are possible in other embodiments. Through the output normalization circuits, the control and data signals coming out of output control circuits 8150, 9250, and 9350 can be level shifted and buffered. As a result of the smaller circuitry of FIG. 9, the overall output pad energy per transition is reduced, because stacks are not required and the final drive transistors (as well as their drivers) can be narrower—half as wide for the final drivers. The present example dissipates approximately 42.4 pJ/transition in simulation using the same slew rate and same load (10 pF) as the design of FIG. 3. This dissipation amounts to 37% of the energy dissipation of the previous design.

In the design of FIG. 3, the majority gate stacked transistors drive the output pad. When one of the three inputs is de-asserted due to a SEE, two of the three branches of the majority gate are also de-asserted, reducing the slew rate by ⅔. If a similar event occurs in the revised design of FIG. 9, it will affect only one transistor of one of NMOS/PMOS pairs 8710, 9720 or 9730 if the SET is produced by an ionizing particle strike on a node beyond the initial level shifters. In such a case, the drive current is reduced by ⅓. If the event occurs on one of the inputs, e.g., originates in the TMR core circuitry, then it affects both transistors in one of NMOS/PMOS pairs 8710, 9720 or 9730. In such a case, the output slew rate is still reduced by ⅓, but this can be brought back to ⅔ by further replicating those paths. For example, on a pad falling edge, one PMOS transistor will remain on, cancelling the current of one of the NMOS pull down transistors. In the event that one transistor is asserted due to an SET, the other still on transistors consume the current, keeping the output relatively stable.

Figure 11:
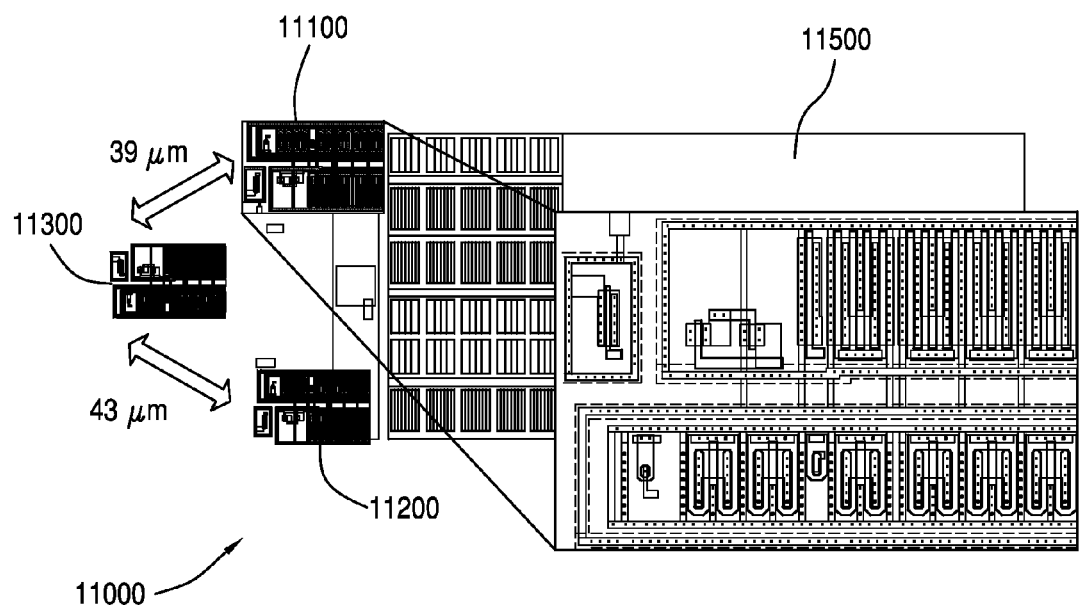
FIG. 11 shows an example of an implementation of a topology for an output pad and related output pad circuitry at a 70 μm pad pitch.

Continuing with the figures, FIG. 10 shows an example of an implementation of a topology for input pad 10500 and input pad circuitry 10000 at a 70 μm pad pitch. FIG. 11 shows an example of an implementation of a topology for output pad 11500 and output pad circuitry 11000 at a 70 μm pad pitch. At this reduced pitch, it is still possible to provide large critical node spacing. For example, input pad circuitry 10000 comprises triple redundant input driving circuits 10100, 10200, and 10300, where input driving circuits 10200 and 10300 are separated from each other by approximately 41 μm, and where input driving circuits 10100 and 10200 are separated from each other by approximately 65 μm. Similarly, output pad circuitry 11000 comprises triple redundant output receiving circuits 11100, 11200, and 11300, where output receiving circuits 11200 and 11300 are separated from each other by approximately 43 μm, and where output receiving circuits 11100 and 11300 are separated from each other by approximately 39 μm. In some examples, input pad circuitry 10000 can be similar to input pad circuitry 1000 (FIG. 1). In the same or other examples, output pad circuitry 11000 can be similar to output pad circuitry 3000 (FIG. 3), and/or to the output portion of input/output pad circuit 9000 (FIG. 9).

Figure 12:
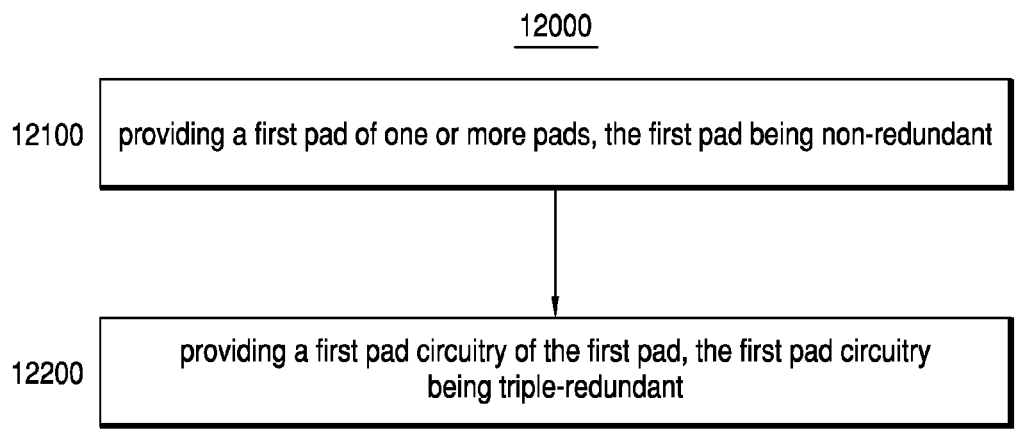
FIG. 12 illustrates a flowchart for a method for providing an integrated circuit with radiation hardened by design protection.

Moving on, FIG. 12 illustrates a flowchart for a method 12000 for providing an integrated circuit with radiation hardened by design protection. In some examples, the integrated circuit can be similar to one of those described above with respect to FIGS. 1-11.

Block 12100 of method 12000 comprises providing a first pad of one or more pads, the first pad being non-redundant. There can be examples where the first pad can be similar to input pad 1500 (FIGS. 1-2), to output pad 1500 (FIGS. 3-4), input/output pad 8500 (FIGS. 8-9), to input pad 10500 (FIG. 10), and/or to output pad 11500 (FIG. 11).

Block 12200 of method 12000 comprises providing a first pad circuitry of the first pad, the first pad circuitry being triple-redundant. In some examples, the first pad circuitry can be similar to input pad circuitry 1000 (FIGS. 1-2), output pad circuitry 3000 (FIGS. 3-4), input/output pad circuitry 9000 (FIG. 9), input pad circuitry 10000 (FIG. 10), and/or to output pad circuitry 11000 (FIG. 11).

In some examples, some of the blocks of method 12000 can be subdivided into several sub-blocks. For example, block 12200 can comprise a sub-block for providing first, second and third pad circuits of the first pad circuitry, where the first, second and third pad circuits are separated from each other by at least approximately 10 μm. In the same or other examples, one or more different blocks or sub-blocks of method 1200 can be combined into a single step or performed simultaneously, and/or the sequence of such procedures can be changed. For example, different parts of the blocks of method 12000 can be provided simultaneously during one or more stages of a semiconductor manufacturing flow used to make the integrated circuit of method 12000. There can also be examples where method 12000 can comprise further or different blocks. Other variations can be implemented for method 12000 without departing from the scope of the present disclosure.

Although the radiation hardened by design digital input/output circuits and related methods herein have been described with reference to specific embodiments, various changes may be made without departing from the spirit or scope of the present disclosure. For example, the techniques and/or circuits described herein may be programmed and/or implemented into an FPGA or other integrated circuit, such as a structured ASIC or a custom design, rather than as part of an ASIC. As another example, the input, output, and input/output pads in the figures herein represent wirebond pads, there can be other examples where non-wirebond pads, such as bump pads or controlled collapse chip connection (C4) pads, can be used in accordance with the present disclosure. Additional examples of such changes have been given in the foregoing description. Accordingly, the disclosure of embodiments herein is intended to be illustrative of the scope of the invention and is not intended to be limiting. It is intended that the scope of this application shall be limited only to the extent required by the appended claims. The radiation hardened by design digital input/output circuits and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An integrated circuit with radiation hardened by design protection, comprising:
    input/output circuitry within the integrated circuit, the input/output circuitry comprising:
    a first pad of one or more pads; and
    a first pad circuitry of the first pad comprising a voltage level shifter;
    wherein:
    the first pad circuitry is coupled to the first pad;
    the first pad circuitry is triple-redundant; and
    a core circuit, wherein the first pad circuitry is located between the first pad and the core circuit;
    a first input path coupled between the first pad and the first pad circuitry to route first, second, and third copies of a data input from the first pad to the first pad circuitry;
    wherein:
    the first pad circuitry comprises:
    a first input driving circuit coupled between the first input path and the core circuit to transmit to the core circuit the first copy of the data input;
    a second input driving circuit coupled between the first input path and the core circuit to transmit to the core circuit the second copy of the data input; and
    a third input driving circuit coupled between the first input path and the core circuit to transmit to the core circuit the third copy of the data input;
    the first, second, and third input driving circuits are triple-redundant to each other; and
    the first, second, and third copies of the data input are triple-redundant to each other; and
    wherein the core circuit comprises:
    an input correction mechanism configured to determine a corrupt state of one of the first, second, or third copies of the data input via majority voting between the first, second, and third data inputs.

2. The integrated circuit of claim 1, wherein:
    the first pad comprises a wirebond pad.

3. The integrated circuit of claim 1, wherein:
    the first pad comprises a non-wirebond pad.

4. The integrated circuit of claim 1, wherein:
    at least a portion of the first pad circuitry is located underneath the first pad.

5. The integrated circuit of claim 1, wherein:
    the first, second, and third input driving circuits are separated from each other by at least approximately 10 μm.

6. The integrated circuit of claim 1, wherein:
    the first input path comprises:
        one or more ESD protection diodes; and
        a current limiting resistance.

7. The integrated circuit of claim 1, wherein:
    the first input driving circuit comprises:
        an input buffer to transmit the first copy of the data input; and
        at least one of:
            a Schmitt trigger to provide hysteresis; or
            a high-to-low voltage level shifter configured to shift the first copy of the data input from a pad input voltage level to a core voltage level.

8. The integrated circuit of claim 7, wherein:
    the second input driving circuit is a copy of the first input driving circuit for the second copy of the data input; and
    the third input driving circuit is a copy of the first input driving circuit for the third copy of the data input.

9. An integrated circuit with radiation hardened by design protection, comprising;
    input/output circuitry within the integrated circuit, the input/output circuitry comprising;
    a first pad of one or more pads; and
    a first pad circuitry of the first pad comprising a voltage level shifter, wherein the the first pad circuitry is coupled to the first pad, the first pad circuitry is triple-redundant, and
    the first pad is non-redundant;
    a core circuit;
    wherein the first pad circuitry is located between the first pad and the core circuit and comprises;
    an output driving circuit coupled to the first pad;
    a first output receiving circuit coupled between the core circuit and the output driving circuit to receive a first copy of a data output from the core circuit;
    a second output receiving circuit coupled between the core circuit and the output driving circuit to receive a second copy of the data output from the core circuit; and
    a third output receiving circuit coupled between the core circuit and the output driving circuit to receive a third copy of the data output from the core circuit;
    the first, second, and third output receiving circuits are triple-redundant to each other; and
    the first, second, and third copies of the data output are triple-redundant to each other;
    and wherein:
    the output driving circuit comprises a majority gate;
    the majority gate is configured to vote the first, second and third copies of the data output together to output an output signal to the first pad; and
    the output signal is representative of a correct state of the data output, regardless of whether one of the first, second, or third copies of the data output is corrupt.

10. The integrated circuit of claim 9, wherein:
    the first output receiving circuit comprises at least one of:
        an output buffer to transmit the first copy of the data output to the output driving circuit; or
        a low-to-high voltage level shifter to shift the first copy of the data output from a core voltage level to a pad output level.

11. The integrated circuit of claim 10, wherein:
    the second output receiving circuit is a copy of the first output receiving circuit for the second copy of the data output; and
    the third output receiving circuit is a copy of the first output receiving circuit for the third copy of the data output.

12. The integrated circuit of claim 9, wherein:
    the majority gate is sized to provide the first pad, in the event of a mismatch of one of the first, second and third copies of the data output, with an output current similar to that of a comparable pad with non-redundant pad circuitry.

13. The integrated circuit of claim 9, wherein:
    the output driving circuit comprises triple-redundant NMOS/PMOS transistor pairs comprising:
        a first NMOS-PMOS transistor pair coupled between the first output receiving circuit and the first pad;
        a second NMOS-PMOS transistor pair coupled between the second output receiving circuit and the first pad; and a third NMOS-PMOS transistor pair coupled between the third output receiving circuit and the first pad.

14. The integrated circuit of claim 9, wherein:
the first pad comprises an input/output pad;
the first output receiving circuit comprises:
   a first output control circuit coupled to a first enable signal path to receive a first enable signal from the core circuit;
the second output receiving circuit comprises:
   a second output control circuit coupled to a second enable signal path to receive a second enable signal from the core circuit;
the third output receiving circuit comprises:
   a third output control circuit coupled to a third enable signal path to receive a third enable signal from the core circuit;
the first, second, and third enable signals are triple-redundant to each other; and
the first, second, and third output control circuits are configured to:
   enable the first pad as an output pad when the enable signal is asserted; and
   enable the first pad as an input pad when the enable signal is de-asserted.

15. The integrated circuit of claim 14, wherein:
when the enable signal is asserted:
   the output driving circuit is configured to drive the first pad based on:
      a value of the first copy of the data output received by the first output control circuit;
      a value of the second copy of the data output received by the second output control circuit;
      and a value of the third copy of the data output received by the third output control circuit.

16. The integrated circuit of claim 14, wherein:
the output driving circuit comprises triple-redundant NMOS/PMOS transistor pairs comprising:
   a first NMOS-PMOS transistor pair coupled between the first output receiving circuit and the first pad;
   a second NMOS-PMOS transistor pair coupled between the second output receiving circuit and the first pad; and
   a third NMOS-PMOS transistor pair coupled between the third output receiving circuit and the first pad;
the first pad is coupled to an input buffer;
when the enable signal is de-asserted, the first, second, and third NMOS-PMOS transistor pairs are tri-stated to permit the first pad to drive the input buffer;
the first output control circuit comprises:
   a first NAND gate comprising:
      a first input coupled to receive the first enable signal;
      a second input coupled to receive the first copy of the data output;
      an output coupled to a PMOS transistor of the first NMOS-PMOS transistor pair; and
   a first NOR gate comprising:
      a first input coupled to receive an inverse of the first enable signal;
      a second input coupled to receive the first copy of the data output; and
      an output coupled to an NMOS transistor of the first NMOS-PMOS transistor pair;
the second output control circuit comprises:
   a second NAND gate comprising:
      a first input coupled to receive the second enable signal;
      a second input coupled to receive the first copy of the data output; and
      an output coupled to a PMOS transistor of the second NMOS-PMOS transistor pair; and
   a second NOR gate comprising:
      a first input coupled to receive an inverse of the second enable signal;
      a second input coupled to receive the first copy of the data output; and
      an output coupled to an NMOS transistor of the second NMOS-PMOS transistor pair; and
the third output control circuit comprises:
   a third NAND gate comprising:
      a first input coupled to receive the third enable signal;
      a second input coupled to receive the first copy of the data output; and
      an output coupled to a PMOS transistor of the third NMOS-PMOS transistor pair; and
   a third NOR gate comprising:
      a first input coupled to receive an inverse of the third enable signal;
      a second input coupled to receive the first copy of the data output; and
      an output coupled to an NMOS transistor of the third NMOS-PMOS transistor pair.

17. The integrated circuit of claim 16, wherein:
the first output receiving circuit comprises:
   first and second output normalization circuits coupled to the first output control circuit;
the second output receiving circuit comprises:
   third and fourth output normalization circuits coupled to the second output control circuit;
the third output receiving circuit comprises:
   fifth and sixth output normalization circuits coupled to the third output control circuit;
the output of the first NAND gate is coupled to the PMOS transistor of the first NMOS-PMOS transistor pair via the first output normalization circuit;
the output of the first NOR gate is coupled to the NMOS transistor of the first NMOS-PMOS transistor pair via the second output normalization circuit;
the output of the second NAND gate is coupled to the PMOS transistor of the second NMOS-PMOS transistor pair via the third output normalization circuit;
the output of the second NOR gate is coupled to the NMOS transistor of the second NMOS-PMOS transistor pair via the fourth output normalization circuit;
the output of the third NAND gate is coupled to the PMOS transistor of the third NMOS-PMOS transistor pair via the fifth output normalization circuit;
the output of the third NOR gate is coupled to the NMOS transistor of the third NMOS-PMOS transistor pair via the sixth output normalization circuit; and
each of the first, second, third, fourth, fifth, and sixth output normalization circuits comprises at least one of:
   an output buffer; or
   a low-to-high voltage level shifter.

18. A method for providing an integrated circuit with radiation hardened by design protection, the method comprising:
   providing a first pad of one or more pads of an input/output circuit within the integrated circuit, the first pad being non-redundant; and
   providing a first pad circuitry of the first pad comprising a voltage level shifter, the first pad circuitry being triple-redundant;
   providing a core circuit of the integrated circuit;

wherein:
providing the first pad comprises:
providing the first pad to comprise at least one of:
an input pad;
an output pad; or
an input/output pad; and
providing the first pad circuitry comprises:
providing a first pad circuit to route a first data copy of a triple redundant data between the core circuit and the first pad;
providing a second pad circuit to route a second data copy of the triple redundant data between the core circuit and the first pad;
providing a third pad circuit to route a third data copy of a triple redundant data between the core circuit and the first pad; and
wherein providing the integrated circuit further comprises providing majority voting between the first, second, third data copies to determine a state of one of the first, second, or third data copies.

19. The method of claim 18, further comprising:
providing the first, second, and third pad circuits separated from each other by at least approximately 10 μm.

20. The method of claim 19, wherein:
providing the first pad comprises:
providing the first pad to comprise an input pad;
providing the first pad circuitry comprises:
providing a first input driving circuit coupled between the first pad and the core circuit to drive to the core circuit the first data copy;
providing a second input driving circuit coupled between the first pad and the core circuit to drive to the core circuit the second data copy; and
providing a third input driving circuit coupled between the first pad and the core circuit to drive to the core circuit the third data copy;
the first, second, and third input driving circuits are triple redundant to each other; and
each of the first, second and third input driving circuits comprises at least one of:
a Schmitt trigger to provide hysteresis; or
a high-to-low voltage level shifter configured to shift the first copy of the data input from a pad input voltage level to a core voltage level.

21. The method of claim 19, wherein:
providing the first pad comprises:
providing the first pad to comprise an output pad;
providing the first pad circuitry comprises:
providing an output driving circuit coupled to the first pad, the output driving circuit comprising at least one of:
a majority gate; or
triple-redundant NMOS/PMOS transistor pairs;
providing a first output receiving circuit between the core circuit and the output driving circuit to receive the first data copy from the core circuit;
providing a second output receiving circuit between the core circuit and the output driving circuit to receive the second data copy from the core circuit; and
providing a third output receiving circuit between the core circuit and the output driving circuit to receive the third data copy from the core circuit;
the first, second, and third output receiving circuits are triple-redundant to each other; and
each of the first, second, and third output receiving circuits comprises at least one of:
an output buffer; or
a low-to-high voltage level shifter.

22. The method of claim 19, wherein:
providing the first pad comprises:
providing the first pad to comprise an input/output pad;
providing the first pad circuitry comprises:
providing a first output control circuit coupled to receive a first enable signal from the core circuit;
providing a second output control circuit coupled to receive a second enable signal from the core circuit;
providing a third output control circuit coupled to receive a third enable signal from the core circuit;
providing the first, second, and third output control circuits to:
enable the first pad as an output pad when a majority of the first, second, and third enable signals are asserted; and
enable the first pad as an input pad when the majority of the first, second, and third enable signals are de-asserted; and
the first, second, and third enable signals are triple-redundant to each other.

* * * * *

UNITED STATES PATENT AND TRADEMARK OFFICE
CERTIFICATE OF CORRECTION

PATENT NO. : 9,191,009 B1
APPLICATION NO. : 12/776188
DATED : November 17, 2015
INVENTOR(S) : Lawrence T. Clark and Kyle E. Nielsen It is certified that error appears in the above-identified patent and that said Letters Patent is hereby corrected as shown below:

In the Claims:

In claim 9 in column 12, line 12, replace "the the" with --the--.

In claim 16 in column 14, line 1, replace "the first copy" with --the second copy--.

In claim 16 in column 14, line 8, replace "the first copy" with --the second copy--.

In claim 16 in column 14, line 16, replace "the first copy" with --the third copy--.

In claim 16 in column 14, line 23, replace "the first copy" with --the third copy--.

Signed and Sealed this
Twelfth Day of July, 2016

Michelle K. Lee
*Director of the United States Patent and Trademark Office*